United States Patent [19]
Galand et al.

[11] Patent Number: 5,054,025
[45] Date of Patent: Oct. 1, 1991

[54] METHOD FOR ELIMINATING ERRORS IN BLOCK PARAMETERS

[75] Inventors: Claude Galand, Cagnes sur Mer; Philippe Elie, LaGaude; Michele Rosso, Nice, all of France

[73] Assignee: International Business Machines Corporation, Armonk, N.Y.

[21] Appl. No.: 185,670

[22] Filed: Apr. 25, 1988

[30] Foreign Application Priority Data

Jun. 12, 1987 [EP] European Pat. Off. ........ 87480002.2

[51] Int. Cl.$^5$ ...................... H03M 3/02; H03M 13/00
[52] U.S. Cl. ..................................... 371/49.1; 371/30; 381/31
[58] Field of Search ........................... 371/30, 31, 49.1; 381/29, 30, 31; 375/34, 122, 30, 26; 370/79, 81

[56] References Cited

U.S. PATENT DOCUMENTS

| | | | |
|---|---|---|---|
| 4,142,071 | 2/1979 | Croisier et al. | 381/29 |
| 4,464,783 | 8/1984 | Beraud et al. | 381/31 |
| 4,792,953 | 12/1988 | Pasdera et al. | 371/31 |
| 4,802,171 | 1/1989 | Rasky | 371/43 |

OTHER PUBLICATIONS

Bhargava, V., "Forward Error Correction Schemes for Digital Communications", IEEE Communications Magazine, Jan. 1983, pp. 11–19.
Haykin, S., Digital Communications, John Wiley & Sons, 1988, pp. 210–218, 379–390.
Tribolet et al., "A Modified Adaptive Transform Coding Scheme with Post-Processing-Enhancement", ICASSP '80 Proceedings, pp. 336–339.
McLaughlin et al., "Speech and Channel Coding for Digital Land-Mobile Radio", IEEE J. Sel. Areas in Comm., vol. 6, No. 2, Feb. 1988, pp. 332–345.

Primary Examiner—Stephen M. Baker
Attorney, Agent, or Firm—Joscelyn G. Cockburn

[57] ABSTRACT

Some signal coding techniques involve quantizing the signal samples using a signal derived parameter to set the quantizer step. This parameter is then used in the decoding process to synthesize the original signal back to its analog form. Any error affecting the integrity of said parameter, between coding and decoding, would affect the synthesized signal. The method proposed here for protecting data integrity involves, at the encoding site, forcing the parameter to a fixed parity. Then, before synthesizing operations are performed, any parameter failing a parity control test is discarded and replaced with a parameter derived from available valid parameter(s).

3 Claims, 5 Drawing Sheets

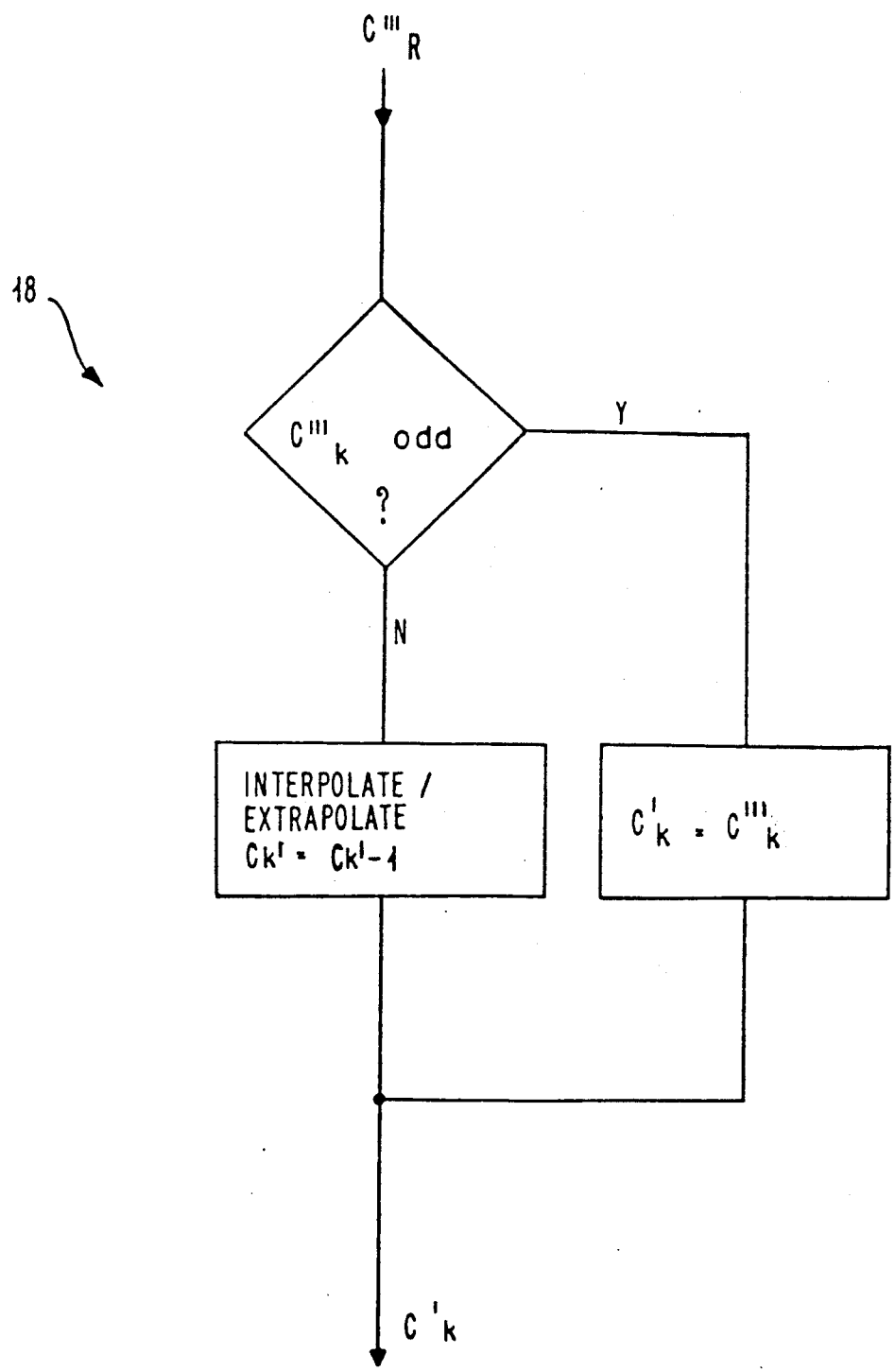

METHOD FOR ELIMINATING ERRORS IN BLOCK PARAMETERS

FIELD OF THE INVENTION

This invention deals with digital encoding of signals and more particularly with a method for improving robustness to noise for digitally encoded signals.

BACKGROUND OF INVENTION

The digital encoding techniques have proven to be well adapted to the transmission or storage of electrical signals, e.g. voice originated signals, in a noisy environment. Some of these techniques involve embedding coding parameters to be used in the subsequent decoding process, within the coded data. Needless to say that any error on the coding parameters is particularly troublesome, as it affects the whole decoding process made to reconstruct the original analog signal. Consequently, methods should be developed to ascertain the highest robustness to noise for the coding parameters. One way for achieving this goal is obtained by duplicating the parameters for storage or transmission purposes. This is bit consuming and should be avoided when bit savings is a must, such as for instance when the encoding is operated over voice signals and the bit rate needs to be minimized. A great deal of efforts have been paid to developing techniques for lowering the coding bit rate through use of sophisticated methods involving companding operations.

One of these techniques, the Block Companded PCM (BCPCM) technique, has proven to be well adapted to the transmission of voice over noisy channels. This technique involves splitting the flow of samples of the original signal into fixed length blocks, deriving from each block of samples a characteristic term "C" (e.g. the largest magnitude sample) and normalizing/quantizing each sample within the considered block with respect to C. The normalized/quantized block of samples together with a digitally encoded representation of C is all that is needed to define the block. This method has been presented by A. Croisier in a lecture given at the 1974 International Seminar on Digital Communications in Zurich, Switzerland, and entitled "Progress in PCM and Delta Modulation : Block Companded Coding of Speech Signal".

Obviously, any error affecting a parameter C, once used to normalize a block of samples, would affect the quality of the synthesized signal represented by the considered block.

The invention provides a method for protecting BCPCM data integrity by protecting the sensitive coding parameter represented by the C term.

Needless to mention that the method applies to different coding schemes and different coding parameters applied to different types of signals, as well. It was successfully applied to BCPCM voice encoding.

SUMMARY OF INVENTION

One object of this invention is thus to provide an efficient method for protecting a coded signal integrity.

Another object is to apply such a method to BCPCM coding techniques, whereby the signal is represented by blocks of samples normalized, with respect to block representative parameter C. Each C data is forced to a predetermined fixed parity (e.g. odd parity) prior to being used for normalizing the samples. Subsequently, at the synthesis level, parity checking is operated over the C's and any invalid C is discarded and replaced by a reconstructed C derived from C's assigned to neighbouring blocks, through interpolation/extrapolation operations.

The foregoing and other objects, features and advantages of the invention, will be made apparent from the following, more particular description of a preferred embodiment of the invention, as illustrated in the accompanying drawings.

BRIEF DESCRIPTION OF THE DRAWINGS

FIG. 7 is a flow-chart for implementing the invention.

FIG. 1 represents the block diagram of a BCPCM Coder. The input signal has been sampled at Nyquist frequency and coded in PCM with 12 bits per sample, to provide a flow of samples S(n), wherein $n = 1, 2, 3 \ldots$ represents the sample rank within the flow of signal samples. S(n) is then applied to a BCPCM quantizer (2) to be quantized therein. The quantizer parameters are updated per block of N samples, N being a predetermined integer value defining a block length.

For each block of N samples, a PEAK PICKING device (4) sorts the N samples of each block to determine a so-called block characteristic term "C" according to:

$$C = \text{Max}(|S(n)|) \qquad (2)$$

$$n = 1, N$$

In other words, the block characteristic is chosen to be equal to the magnitude of the largest sample in the considered block.

The block characteristic term C is then usually digitally encoded with 5 bits in a CHARACTER CODER 6, providing a C' digital term. The 5-bit recoding of the 12-bit encoded block characteristic C, consists in finding the upper bound C' among 32 quantizing levels, and can be implemented either through a straightforward or through a dichotomic search. The straightforward search algorithm is described hereafter: a logarithmic companded table CTABQL is used. The decision levels are set as follows.

TABLE

| (CTABQL) | | | |
|---|---|---|---|
| 1 | 2 | 3 | 4 |
| 7 | 10 | 14 | 24 |
| 36 | 44 | 52 | 60 |
| 72 | 88 | 104 | 120 |
| 144 | 176 | 208 | 240 |
| 288 | 352 | 416 | 480 |
| 576 | 704 | 832 | 960 |
| 1202 | 1458 | 1664 | 2047 |

Figure 2:
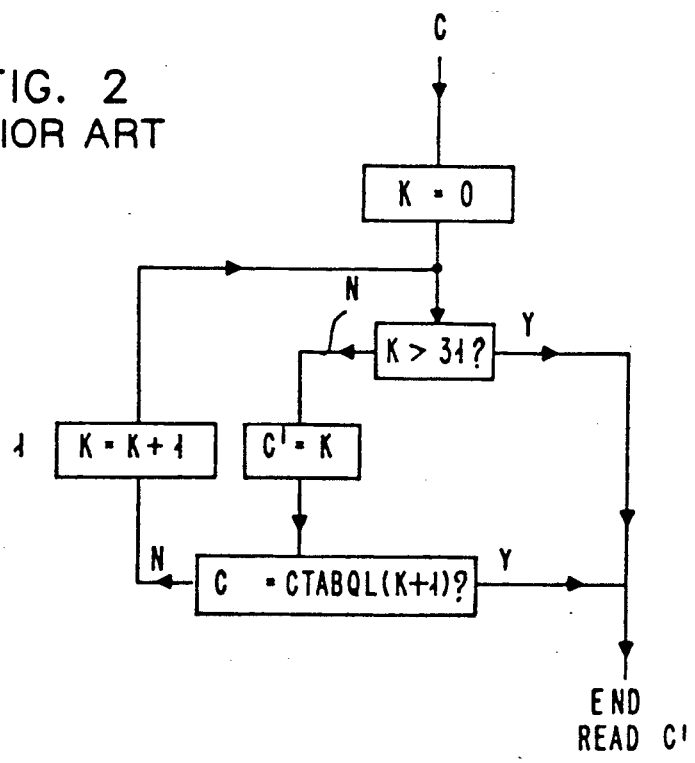
FIG. 2 is a flow-chart for one of the blocks of FIG. 1.

The 12 to 5-bit encoding is performed through the scanning of the above table, using the algorithm represented in FIG. 2. In other words, the 12-bit coded magnitude of C (decimal value between 0 and 2 047) would be converted into a 5-bit coded TABLE location.

For example, assume C=8 the decimal value of the 12-bit encoded C, i.e. "000000001000". A variable parameter K is set to zero. Since zero<31 then C' is set to zero (C'=0) and tested by reading the content of first position of the TABLE. Said content is equal to one. Then, the test (8<1?) fails and, K is set to 1. Is 1>31? No, then C'=1 and the test (8<2?) is again performed and fails. And so on until C'=5 is reached since next TABLE address store 10>8. The value C' is thus 5-bit encoded to "00101".

The decoding of the block characteristic will consist in deriving a reconstructed value C" for the block characteristic from the transmitted 5 bits C'. This can be efficiently implemented by a table look-up:

$$C' = CTABQL\ (1 = C) \tag{1}$$

The coded C' terms are applied to a multiplexer (8) to be transmitted over a transmission channel toward a receiver.

In the following we will address transmission application, but storage or any other application might be considered as well. As already mentioned, the block characteristic terms C are used to normalize the samples, or, in other words, to adjust the BCPCM quantizer step. To minimize quantizing noise due to said quantizer step adjustment, the coded C' are decoded into C" in (10) prior to being used to adjust the BCPCM Quantizer step Q, according to:

$$Q = C'/2^{n'-1} \tag{3}$$

wherein n' is the number of bits assigned to the quantizer for quantizing each signal sample.

Each block sample S(n) is then quantized into an S'(n) digital value according to:

$$S'(n) = <S(n)/Q> \tag{4}$$

where $<X>$ denotes the truncation to the lowest integer value of X, and $n = 1, 2, \ldots, N$.

It should be noted here, that the quantizing step for a current block of samples, could as well be adjusted, using the C term, derived from the previous block and delayed one block to enable starting quantizing operations on the current block of samples with no delay on quantizing operations.

Figure 3:
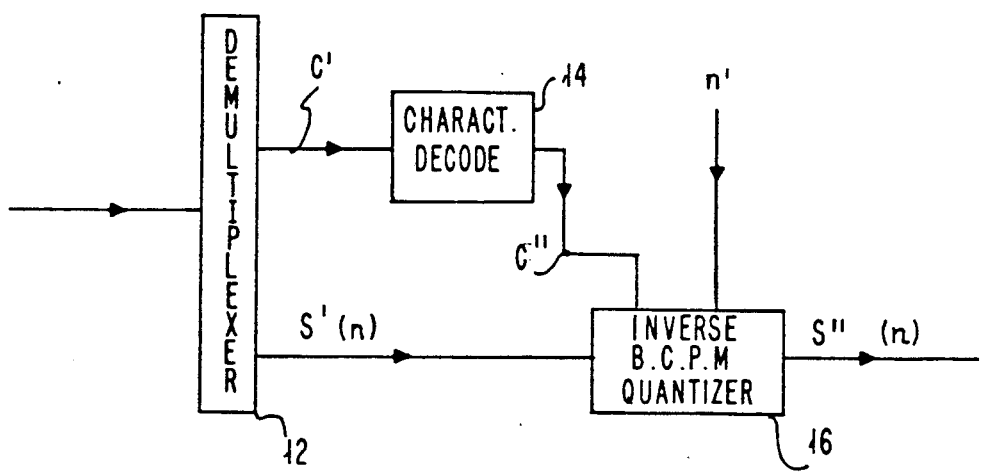
FIG. 3 is a block diagram of a BCPCM decoder/receiver.

The S'(n) digital values are then multiplexed in the multiplexer (8) with the coded C', and transmitted in a common flow of data over the transmission channel toward the receiver of FIG. 3.

The receiver includes a demultiplexer 12 where the 5-bit coded characteristics C' and quantized samples S'(n) are separated from each other. The C' are decoded in (14) into C" terms used to adjust an inverse quantizer (16) step Q, according to the above expression (3). The conversion from C' to C" is operated by simply reading the content of address (1+C') in the above represented TABLE. Then, the samples S"(n) are reconstructed back, according to:

$$S''(n) Q \times (S'(n) = 0.5) \tag{5}$$

for $n = 1, \ldots N$.

The BCPCM coding technique has proven to be well adapted to the transmission of voice over noisy digital channels, but, obviously, the item most important to protect from noise, is the C parameter, in view of it being used to adjust the quantizer step and thus susceptible of affecting precision on a whole block of samples if affected in its integrity.

The following proposed method increases the BCPCM robustness without adding redundancy bits to the transmitted frames, by improving robustness of the C's parameters to noise.

Figure 1:
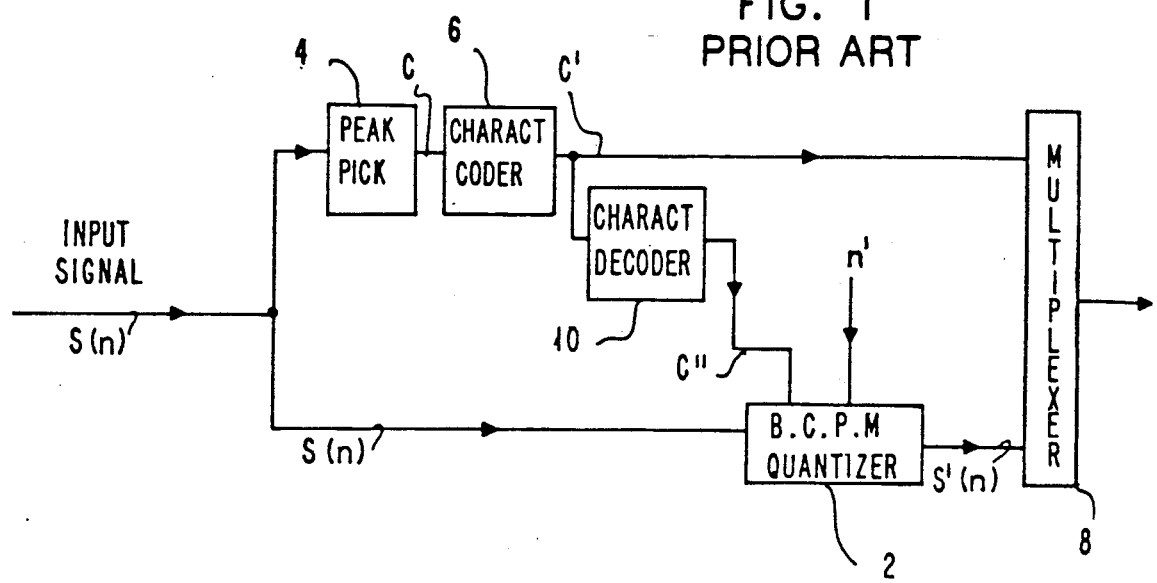
FIG. 1 is a block diagram of a BCPCM coder/transmitter.
Figure 4:
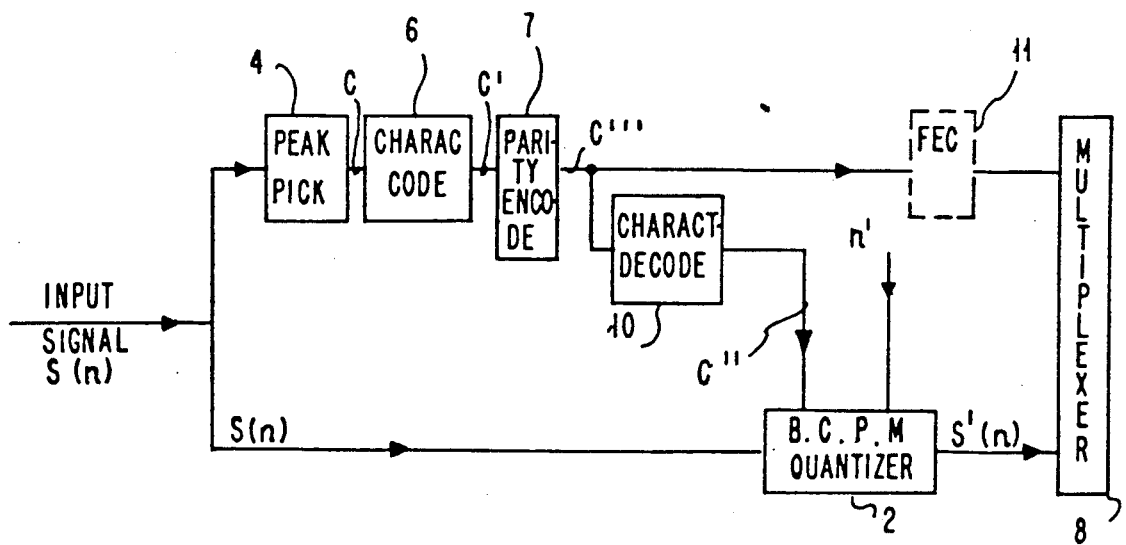
FIG. 4 is a block diagram of the coder of FIG. 1 made to include the invention.

Represented in FIG. 4 is a block diagram of a BCPCM coder, as represented in FIG. 1, made to include the invention. The receiver includes an additional device, i.e. a parity encoder 7 converting the coded C' into a C'" term prior to it being decoded into the C" value used to set the quantizer step Q.

Figure 5:
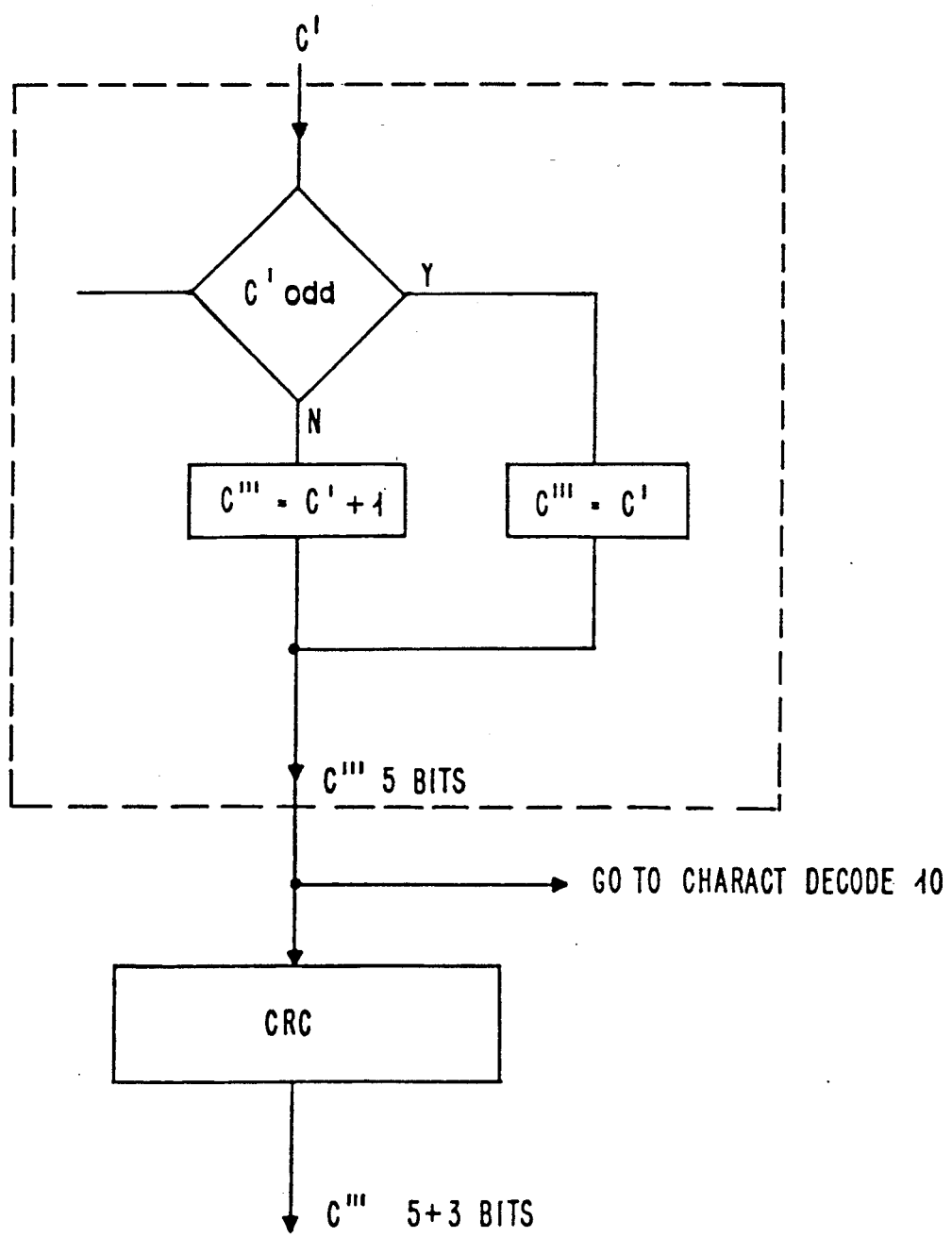
FIG. 5 is a flow-chart for implementing the invention.

The conversion from C' to C'" is achieved by forcing C' to a predetermined fixed parity. First, the parity of the coded characteristic C' is computed. If said parity is not the odd parity selected as the predetermined fixed parity for this implementation, then C' is incremented until an odd parity is obtained. What makes this invention even more attractive, is that the means for implementing it, are rather simple, thus inexpensive. The flow chart for operating device 7 of FIG. 4 is represented in FIG. 5. The 5 bits coded C' parity is simply checked. If C' is odd, then C'"=C', otherwise, C'"=C'=1. The output C'" is thus a 5-bit coded odd valued data which is fed into the characteristic decode device 10. It could also either be multiplexed as such into the multiplexer 8, or be itself protected by being assigned a 3-bit CRC into an error correction (FEC) device 11 prior to it being multiplexed. In practice, the CRC term would rather be assigned to a group of C terms.

Inserting the parity encoder at the input of the characteristic decoder 10, enables minimizing the incidence of forcing the parity of the characteristic terms due to device 7, over the sample quantizing process.

Figure 6:
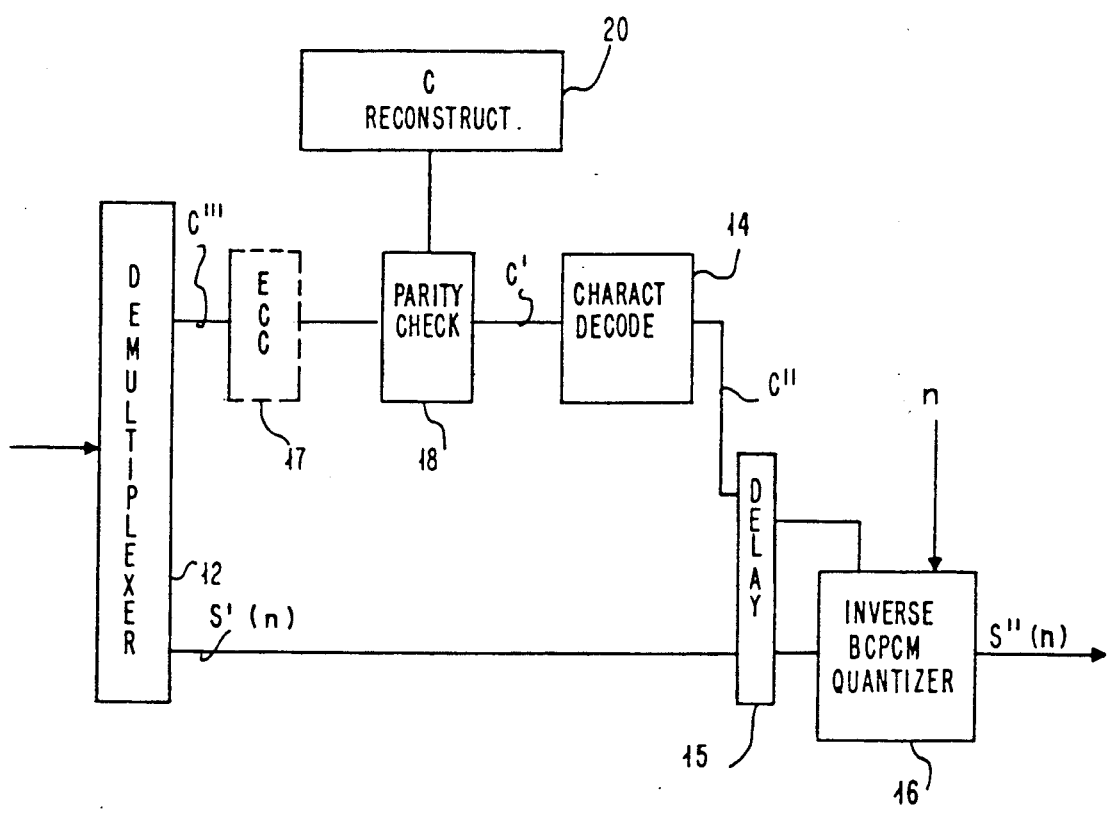
FIG. 6 is a block diagram of the decoder of FIG. 2 arranged to include the invention.

Represented in FIG. 6 is a block diagram of the receiver to be used with the invention. It is derived from the receiver of FIG. 3 and corresponding devices have been assigned same references. The received data flow is demultiplexed in device 12 to separate the samples S'(n) from the forced parity characteristics C'". Should a CRC be assigned to C'", then conventional Error Checking and Correction would be operated in a conventional error checking and correcting device ECC 17, prior to getting the forced parity C'". The C'" are parity checked in a device 18. If said parity is not ODD, the involved characteristic term is simply considered invalid and discarded. Generation of a reconstructed characteristic term is started. For that purpose, previously received valid characteristic terms have been stored in a delay line within a C reconstruct device 20 made to reconstruct a valid characteristic term. The flow-chart for the corresponding algorithm is represented in FIG. 7. Assuming the BCPCM block time index be k, then:

if $C_k'"$ is odd then $C_k' = C_k'"$ if $C_k'"$ is even then interpolate or extrapolate.

The flow-chart has been made for the simplest extrapolation (i.e. first order extrapolation), then $C_k' = C'_{k-1}$.

In this case, the C reconstruction device 20 is made with a one block delay device.

Higher order extrapolation may be achieved. For a second order extrapolation the delay line should be two-block long (i.e. $C'_{k-2}$ and $C'_{k-1}$). In this case, the current $C'_k$ would then be reconstructed to be:

$$C'_k = 2 C'_{k-1} - C'_{k-1} \qquad (6)$$

More complex extrapolation rules, or even interpolation, might also be considered. For interpolation one would derive $$C'_k = \tfrac{1}{2}(C'_{k-1} = C'_{k=1}) \qquad (7)$$

This implies a one block delay in the receiver (see DELAY device 15 in FIG. 6).

Therefore, the method of this invention takes advantage of the ability of the quantizer to compensate for a deviation in the individual characteristic terms. It could easily be extended to sub-band coding wherein the signal to be quantized is split into a predetermined number (p) of frequency sub-bands. Each sub-band being assigned a quantizer, straightforward extension of the above described invention could be made to each sub-band quantizer. In this case, the additional CRC protection would apply to the p characteristics, considered globally. It could also be applied to Pulse Excited methods wherein consecutive segments of signals are each represented by a series of regularly (RPE) or non regularly (MPE) spaced samples.

It can be noted that the protection scheme, described here, can be used in addition to a more sophisticated Error Correcting Code, since the encoded data itself can be included in a code word. For example, while the proposed method is mainly valuable for detecting random errors, the additional Error Correcting Code could be capable of correcting burst errors, resulting in a high performance protection scheme.

Also, although the description of the preferred embodiment was performed on a BCPCM coder, the proposed method can be applied to the protection of encoded parameters using an encoding scheme similar to the BCPCM.

We claim:

1. An apparatus for controlling error in digitally encoded data wherein said encoding involves quantizing operations with a quantizer being adjusted using a signal dependent parameter, said apparatus comprising:
   an encoder including,
      means for determining the signal dependent parameter;
      means for forcing the parity of said signal dependent parameter to a preselected parity;
   a decoder including
      means for checking the parity of said parameter;
      means for discarding the parameter and regenerating a parameter from previously received signal dependent parameters if the parity of a parameter is unlike the preselected parity; and
      means for using the parameter to reconstruct transmitted data if the parity is like the preselected parity.

2. A method for eliminating errors associated with a digitally encoded signal wherein said encoding involves quantizing operations with the quantizer being adjusted using a signal dependent parameter said method involving:
   for the encoding: forcing the parity of said parameter to a preselected parity;
   forwarding to a decoder the parameter with its forced parity and quantized sampled information;
   for the decoding: checking the parity of said parameter, discarding any parameter whose parity is different from the preselected parity; and regenerating a parameter by extrapolating characteristics of at least two previously received signal dependent parameters, each being from a different block.

3. A method for eliminating errors associated with a digitally encoded signal wherein said encoding involves using block companded PCM (BCPCM) encoding technique, wherein the signal is sampled, split into blocks of samples to be quantized individually using the BCPCM block characteristic term C to adjust the quantizing step and a signal dependent parameter to be protected, said method involving:
   for the encoding:
      forcing the parity of said parameter to a preselected parity;
   for the decoding:
      checking the parity of said parameter;
      discarding any parameter whose parity is different from the preselected parity; and
      regenerating the parameter by interpolating between the characteristic terms of blocks neighboring a currently processed block.

* * * * *